United States Patent [19]
Kato et al.

[11] Patent Number: 5,390,710
[45] Date of Patent: Feb. 21, 1995

[54] ELECTRICAL INTERCONNECTION ASSEMBLY MANUFACTURING APPARATUS

[75] Inventors: Sanae Kato; Akira Sugiyama, both of Shizuoka, Japan

[73] Assignee: Yazaki Corporation, Tokyo, Japan

[21] Appl. No.: 111,456

[22] Filed: Aug. 25, 1993

[30] Foreign Application Priority Data

Aug. 26, 1992 [JP] Japan ............... 4-226968

[51] Int. Cl.⁶ .................................. B21F 27/00
[52] U.S. Cl. ............................ 140/92.1; 29/755
[58] Field of Search ............ 140/92.1, 93 R; 29/755

[56] References Cited

U.S. PATENT DOCUMENTS

| | | | |
|---|---|---|---|
| 3,523,353 | 8/1970 | Drinkard et al. | 140/92.1 |
| 3,804,130 | 4/1974 | Tarbox et al. | 140/92.1 |
| 3,989,338 | 11/1976 | Gosser. | |
| 5,156,557 | 10/1992 | Okafuji et al. | |

*Primary Examiner*—Lowell A. Larson
*Attorney, Agent, or Firm*—Finnegan, Henderson, Farabow, Garrett & Dunner

[57] ABSTRACT

An apparatus for manufacturing electrical interconnection assembly in which a wire is laid on wire laying pins on a pin board or an insulating support body at high velocity and with high density. The electrical interconnection assembly manufacturing apparatus according to the present invention comprises: a pinboard; a plurality of wire laying pins standing on the pinboard; a slide plate opposing tips of the wire laying pins; and a nozzle attached to the slide plate, wherein the pinboard and the slide plate relatively move under the condition that the pinboard opposes the slide plate while a wire fed from the nozzle is laid on the plurality of wire laying pins.

3 Claims, 5 Drawing Sheets

ELECTRICAL INTERCONNECTION ASSEMBLY MANUFACTURING APPARATUS

BACKGROUND OF THE INVENTION

1. Field of the Invention

The present invention relates to an apparatus for manufacturing electrical interconnection assembly in which a wire is laid on wire laying pins on a pin board or an insulating support body at high velocity and with high density.

2. Description of the Prior Art

FIG. 3 shows a conventional electrical interconnection assembly manufacturing apparatus which is disclosed in Japanese patent application No. Heisei 2299069. In the electrical interconnection assembly manufacturing apparatus 30, a wire extracting nozzle 5' is positioned among a plurality of wire laying pins 3' and a pin board 2' is horizontally moved together with an X-Y feeding mechanism while a wire 7' being extracted from the wire extracting nozzle 5' with a single stroke.

The pin board 2' is movably supported in the vertical direction by four leg posts via compression coil springs 10'. Pin holes 31 are formed on the pin board 2', and a wire laying pallet 11', which is fixed to the posts 9', opposes the pin board 2'. Further, the posts 9' are normal to a bottom plate 8' and the bottom plate 8' is fixed to a driven plate which is attached to a screw rod 12' of the X-Y feeding mechanism 6'.

The wire 7' is laid from the wire extracting nozzle 5' between the wire laying pins 3' on pin board 2', which is driven by the X-Y feeding mechanism 8'.

FIG. 4 shows a perspective view when the wire laying operation is completed. Then, the wire 7' is moved from the wire laying pallet 11' illustrated in FIG. 4 to an electrical junction box 32 shown in FIG. 8. That is, the electrical junction box 32 is placed on the pin board 2' upside down, and pins 34 on an insulating support body 33 push the wire laying pins 3', and the pin board 2' and all is lowered to squeeze the wire 7' between the pins 34. Then, the wire 7' is forced fixed to wire receiving terminals 35 to finish the wiring operation.

However, with the convention electrical interconnection assembly manufacturing apparatus 30 described above, the wire extracting nozzle 5' is prone to interfere with the wire laying pins 3' when the wire 7' is laid on the pin board 2'. This may cause the wire extracting nozzle 5' to be damaged. As a result, the speed of the wiring operation cannot be increased. Moreover, the distance L between the pins 3' should be larger than the outer diameter of the wire extracting nozzle 5', which prevents the wire 7' from being laid on the pin board 2' or the like with high density.

SUMMARY OF THE INVENTION

The present invention has been accomplished to eliminated the drawbacks of the conventional electrical interconnection assembly manufacturing apparatus described above, and the object thereof is to provide an electrical interconnection assembly manufacturing apparatus in which the interference between the nozzle and the wire laying pins is prevented to increase the wiring speed with high wiring density. The electrical interconnection assembly manufacturing apparatus according to the present invention comprises: a pinboard a plurality of wire laying pins standing on the pinboard; a slide plate opposing tips of the wire laying pins; and a nozzle attached to the slide plate, wherein the pinboard and the slide plate relatively move under the condition that the pinboard opposes the slide plate while a wire fed from the nozzle is laid on the plurality of wire laying pins.

Further, another electrical interconnection assembly manufacturing apparatus according to the present invention is characterized in that a tip of the nozzle is flush with a face of the slide plate opposing the pinboard. In the manufacturing apparatus described above, the slide plate may slidably contact with the tips of the wire laying pins during the relative movement of the pinboard and the slide plate. The slide plate may preferably be made of transparent resin to observe the wiring operation.

BRIEF DESCRIPTION OF THE DRAWINGS

The present invention will be more apparent from the ensuring description with reference to the accompanying drawing wherein.

DETAILED DESCRIPTION OF PREFERRED EMBODIMENTS

Figure 1:
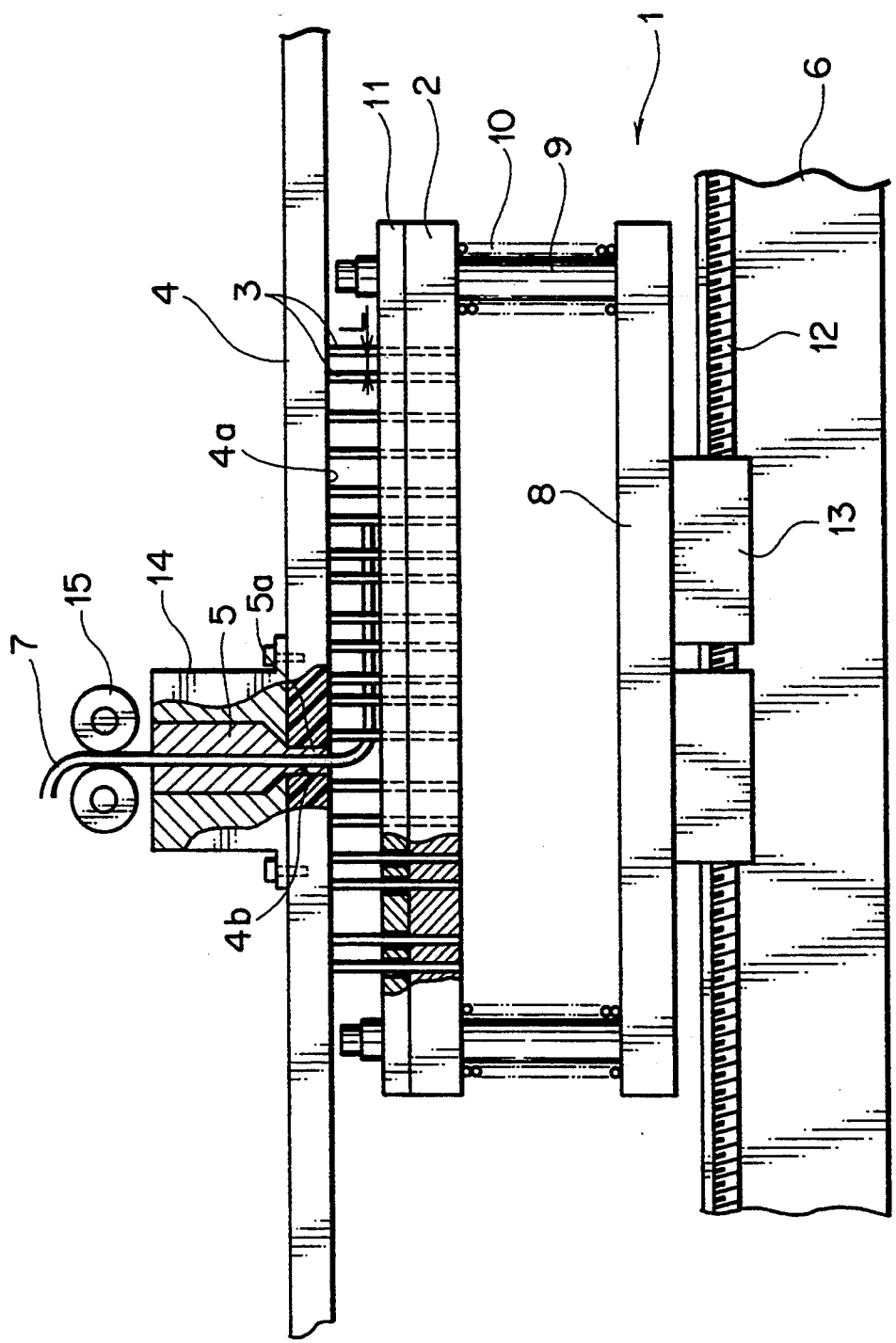
FIG. 1 is a partially cutaway front view of a primary portion of an electrical interconnection assembly manufacturing apparatus according to a first embodiment of the present invention.

FIG. 1 shows an electrical interconnection assembly manufacturing apparatus according to the first embodiment of the present invention.

The manufacturing apparatus according to the first embodiment is provided with a slide plate 4 made of transparent resin such as an acrylic resin. The slide plate 4 opposes tips of wire laying pins 3 made of metal which stand on a metal pin board 2, A nozzle portion 5 made of metal is attached to the slide plate 4 so as not to project downward from a face 4a of the slide plate 4 which opposes the wire laying pins 3. The pin board 2 is horizontally movable by an X-Y feeding mechanism 6 to cause the wire laying pins 3 to approach the face 4a of the slide plate 4 and the nozzle portion 5 feed a wire 7 in synchronization with the movement of the pin board 2 to lay the wire between the wire laying pins 3. The slide plate 4 may slidably contact with the tips of the wire laying pins 3 at the face 4a thereof during the wiring operation.

The pin board 2 is movably supported in the vertical direction by four leg posts 9 attached to a bottom plate 8 via compression coil springs 10 like the conventional apparatus. A wire laying pallet 11 made of metal is positioned on the pin board 2. Further, the bottom plate 8 is connected to a driven plate 13 of a screw rod 12 of the X-Y feeding mechanism 6.

The slide plate 4 is made of transparent resin to observe the wiring operation and to decrease slide abrasion or the like when the slide plate 4 is in contact with the tips of the wire laying pins 3. The nozzle portion 5 is inserted into a nozzle hole 4b formed on the slide plate 4 at a tip thereof and the tip 5a is flush with the face 4a and is fixed to the slide plate 4 by way of a block 14. The wire 7 in the nozzle portion 5 is fed through transportation rollers 15 or the like. The nozzle hole 4b of the slide plate 4 may directly be used as a nozzle portion.

Figure 2:
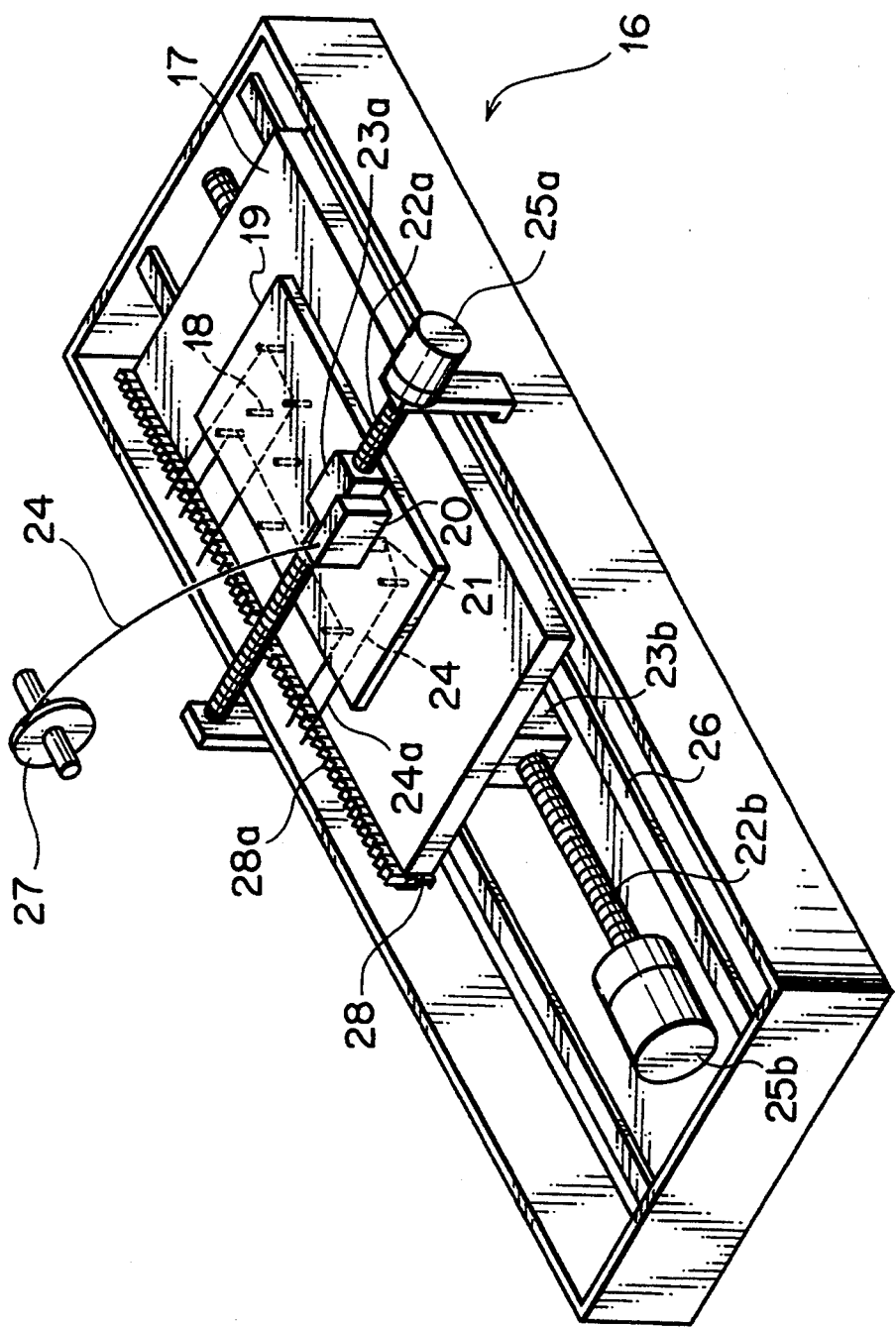
FIG. 2 is a perspective view of an electrical interconnection assembly manufacturing apparatus according to a second embodiment of the present invention.
Figure 3:
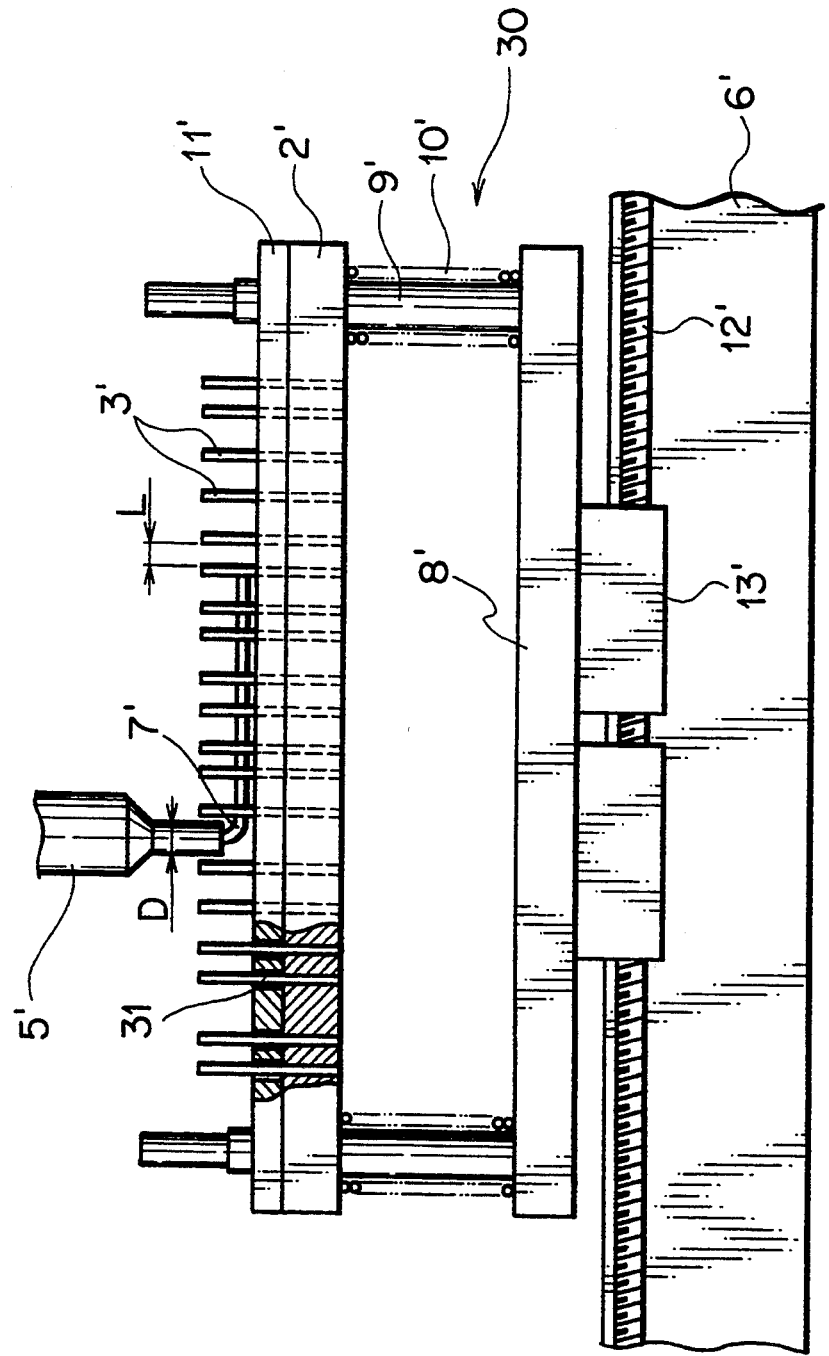
FIG. 3 is a partially cutaway front view of a primary portion of a conventional electrical interconnection assembly manufacturing apparatus.
Figure 4:
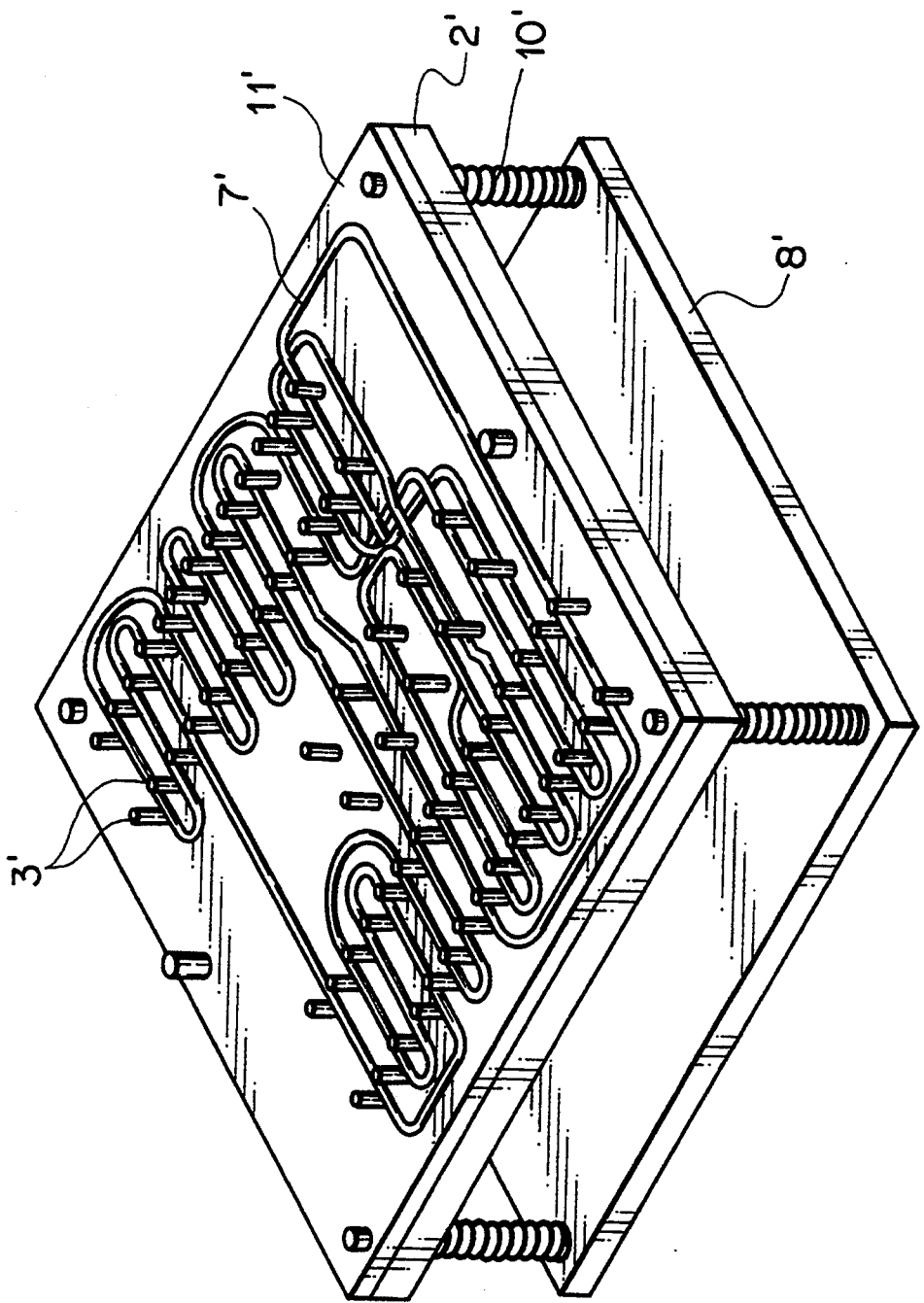
FIG. 4 is a perspective view of a conventional electrical interconnection assembly manufactured by the apparatus illustrated in FIG. 3 when the wiring operation is completed.
Figure 5:
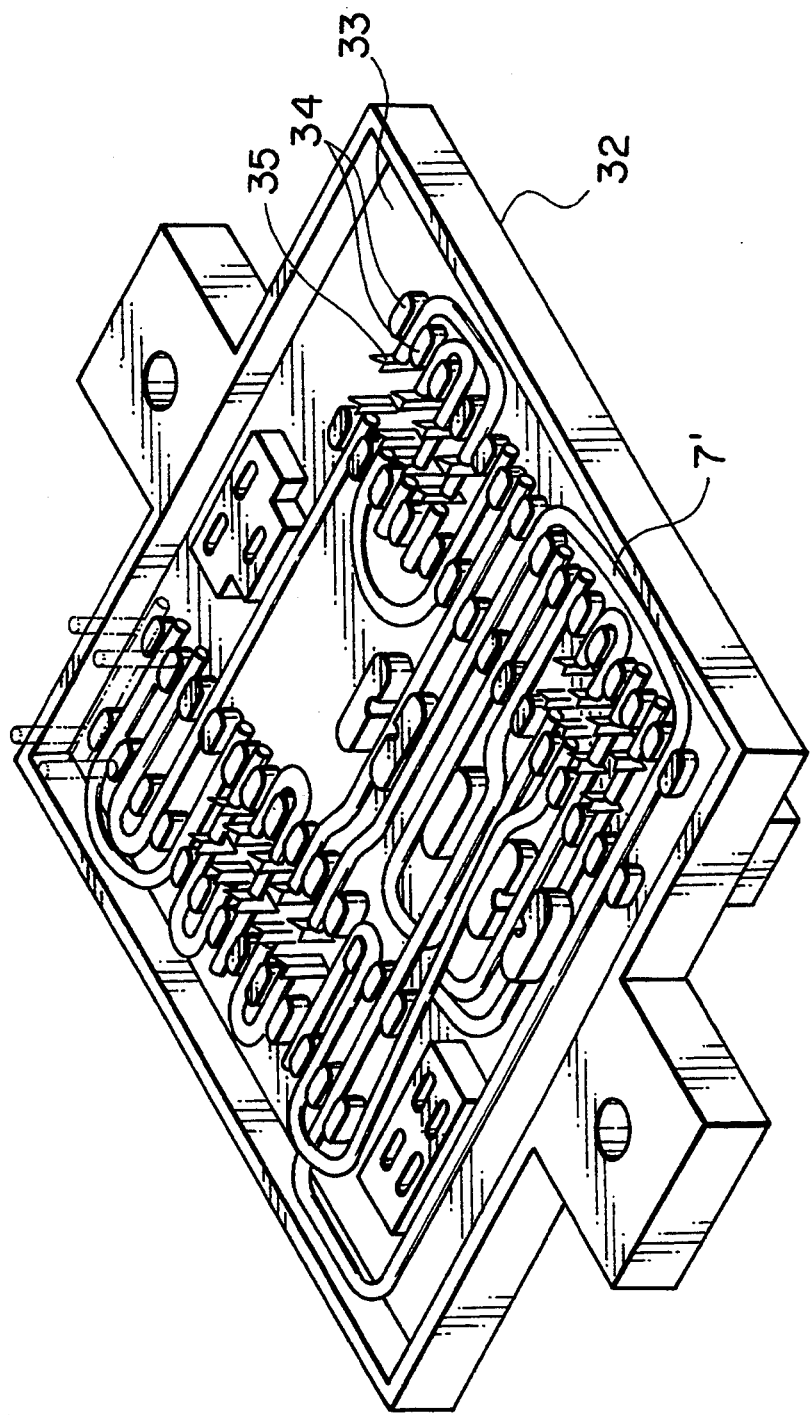
FIG. 5 is a perspective view of the conventional electrical interconnection assembly in which a wire is replaced to an electrical junction box.

FIG. 2 shows another electrical interconnection assembly manufacturing apparatus according to the second embodiment of the present invention. The manufacturing apparatus has been made by modifying an electrical interconnection assembly manufacturing apparatus which was disclosed in Japanese patent application No. Heisei 1130423, in which a slide plate 19 made of transparent resin is situated in close proximity to or slidably contact with tips of wire laying pins 18 standing on a pinboard 17. Further, a nozzle portion 21 of a wire holder 20 is attached to the slide plate 19 without a projecting portion like the manufacturing apparatus according to the first embodiment of the present invention. The wire holder 20 is fixed to a driven plate 23a of a screw rod 22a extending in the X direction and the pin board 17 is fixed to a driven plate 23b of a screw rod 22b disposed in the Y direction. Under the condition described above, the slide plate 19 and the pin board 17 move relatively to lay the wire 24 from the nozzle portion 21 on the wiring pins 18.

The screw rods 22a and 22b are driven by motors 25a and 25b and the pin board 17 slides on a guide rail. The slide plate 19 moves in close proximity to or slidably contact with the wire laying pins 18. The wire 24 is fed to the wire holder 20 from a reel 27 and is laid on the pins 18. A front end 24a of the wire 24 is cramped by a cramp 28a made of synthetic resin attached to a rod 28.

As describe above, with an electrical interconnection assembly manufacturing apparatus according to the present invention, the slide plate opposes the wire laying pins and the nozzle portion is attached to the slide plate. As a result, the nozzle portion is not interfered with the wire laying pins, which increases the speed of the wiring operation and prevents the wire from being slipped off from the wire laying pins at the wiring operation, resulting in improved reliability of the wiring operation. Further, the distance between the wire laying pins is narrowed up to a substantially outer diameter of the wire, resulting in high wiring density.

What is claimed is:

1. An electrical interconnection assembly manufacturing apparatus comprising:
   a pinboard
   a plurality of wire laying pins standing on the pinboard;
   a slide plate opposing tips of the wire laying pins; and
   a nozzle having a tip flush with a face of the slide plate opposing the pinboard, the pinboard and the slide plate being relatively movable when the pinboard opposes the slide plate while a wire fed from the nozzle is laid on the plurality of wire laying pins.

2. The electrical interconnection assembly manufacturing apparatus as claimed in claim 1, wherein the slide plate contacts with the tips of the wire laying pins during the relative movement of the pinboard and the slide plate.

3. The electrical interconnection assembly manufacturing apparatus as claimed in claims 1 or 2, wherein the slide plate is made of transparent resin.

* * * * *